(12) United States Patent
Hall et al.

(10) Patent No.: US 10,679,960 B2
(45) Date of Patent: Jun. 9, 2020

(54) HEAT RESISTANT AND SHOCK RESISTANT INTEGRATED CIRCUIT

(71) Applicants: David R. Hall, Provo, UT (US); Marshall Soares, Taylorsville, UT (US); Derek Maxwell, Sandy, UT (US); Richard Rea, Lehi, UT (US)

(72) Inventors: David R. Hall, Provo, UT (US); Marshall Soares, Taylorsville, UT (US); Derek Maxwell, Sandy, UT (US); Richard Rea, Lehi, UT (US)

(73) Assignee: Hall Labs LLC, Provo, UT (US)

( * ) Notice: Subject to any disclaimer, the term of this patent is extended or adjusted under 35 U.S.C. 154(b) by 0 days.

(21) Appl. No.: 15/490,502

(22) Filed: Apr. 18, 2017

(65) Prior Publication Data

US 2018/0301400 A1 Oct. 18, 2018

(51) Int. Cl.
| | | |
|---|---|---|
| H01L 23/495 | (2006.01) | |
| H01L 23/29 | (2006.01) | |
| H01L 23/00 | (2006.01) | |
| H01L 21/48 | (2006.01) | |
| H01L 23/498 | (2006.01) | |
| H01L 23/18 | (2006.01) | |

(52) U.S. Cl.
CPC .......... *H01L 24/48* (2013.01); *H01L 21/4867* (2013.01); *H01L 23/18* (2013.01); *H01L 23/295* (2013.01); *H01L 23/4952* (2013.01); *H01L 23/49513* (2013.01); *H01L 23/49866* (2013.01); *H01L 21/4853* (2013.01); *H01L 2224/4823* (2013.01); *H01L 2224/48237* (2013.01); *H01L 2924/351* (2013.01)

(58) Field of Classification Search
CPC ........... H01L 23/49513; H01L 23/4952; H01L 23/295; H01L 23/3142; H01L 23/315
See application file for complete search history.

(56) References Cited

U.S. PATENT DOCUMENTS

| | | | | |
|---|---|---|---|---|
| 5,209,786 | A * | 5/1993 | Rolfe | H01L 35/32 136/211 |
| 2010/0078833 | A1* | 4/2010 | Nakazato | H01L 21/561 257/787 |
| 2010/0109140 | A1* | 5/2010 | Oh | B23K 20/005 257/690 |
| 2010/0320592 | A1* | 12/2010 | Takano | H01L 21/565 257/692 |
| 2017/0092510 | A1* | 3/2017 | Oh | H01L 21/4825 |
| 2017/0301650 | A1* | 10/2017 | Yu | H01L 23/295 |

* cited by examiner

Primary Examiner — Phat X Cao

(57) ABSTRACT

A heat and shock resistant integrated circuit (IC) of the present invention includes a base material, a metal layer disposed on the base material, a silicon die disposed on the metal layer, additive material disposed on the base material, gas filled filler material disposed between the additive material and the silicon die, and first traces electrically connecting the silicon die to the additive material. Packing of the integrated circuit provides exceptional thermal stress relief and impact protection of circuitry within the packaging.

19 Claims, 7 Drawing Sheets

HEAT RESISTANT AND SHOCK RESISTANT INTEGRATED CIRCUIT

BACKGROUND

Field of the Invention

The present invention relates construction of heat and shock resilient integrated circuits (ICs).

Background of the Invention

Integrated circuit chips (Ics) typically operate at relatively low temperatures to avoid thermal failure and are prone to failure upon a mechanical impact event. A temperature stable and impact reliable IC is needed and is provided by the instant disclosure.

SUMMARY

This invention has been developed in response to the present state of the art and, in particular, in response to the problems and needs in the art that have not yet been fully solved by currently available systems and methods. Accordingly, a gas filled filler material integrated circuit (IC) packaging has been developed Features and advantages of different embodiments of the invention will become more fully apparent from the following description and appended claims, or may be learned by practice of the invention as set forth hereinafter.

A heat and shock resistant integrated circuit (IC) of the present invention includes a base material, a metal layer disposed on the base material, a silicon die disposed on the mend layer, additive material disposed on the base material, gas filled filler material disposed between the additive material and the silicon die, and first traces electrically connecting the silicon die to the additive material. Packing of the integrated circuit provides exceptional thermal stress relief and impact protection of circuitry within the packaging. The gas filled filler material may comprises one or more of gas filled spheres, gas filled micro balloons, gas filled micro balls, or gas filled micro geometric shapes. Such materials may be produced by chemical bubbling or gas bubbling through a glass, polymer, or other curable resin to form gas filled particles or shapes.

At least a portion of the additive material of the IC may be printed material such as epoxies, thermoplastics, thermosetting resins, metals, alloys, aluminum oxide, silicon oxide, silicon dioxide, silicon nitride, titanium oxide, aluminum nitride, diamond, calcium carbonate, oxides, polymers, polyanilines, polythiophenes, poly-p-phenylene sulfides, polyacetylenes and mixtures thereof and copolymers made from the monomers to form the above polymers. The additive material may be printed starting at the base material to a height which is substantially planar to a top surface of the silicon die. Second traces electrically connecting the first traces to an outer package of the integrated circuit may be used to connect the outer package electrically with the silicon die. A flexible material may surround gas filled filler material forming an elastic filler material between the additive material and the silicon die. The elastic filler material may additionally comprise elastomeric material poured between the gas filled filler material. The gas filled filler material may comprises one or more of gas filled spheres, gas filled micro balloons, gas filled micro balls, or gas filled micro geometric shapes. Such materials may be produced by chemical bubbling or gas bubbling through a glass, polymer, or other curable resin to form gas filled particles or shapes. The elastomeric material may comprise epoxies, thermoplastics, thermosetting resins, metals, alloys, oxides, polymers, polyanilines, polythiophenes, poly-p-phenylene sulfides, polyacetylenes and mixtures thereof and copolymers made from monomers to form the above polymers. The elastic filler material may form a generally planar surface to the top surface of the silicon die. The first traces may be bond wires connecting the silicon die to the additive material. The additive material may form at least a portion of a packaging of the silicon die. The gas balls may form at least a portion of the packaging of the silicon die. The second traces may connect the bond wires to one or more electrically conductive pins, balls, or traces on the outer package of the integrated circuit. The outer package may be one of a pin grid array, ball grid array, fine pitch ball grid array, low profile ball grid array, ceramic package, ceramic dual inline package, ceramic leadless carrier, ceramic ball, grid array, ceramic small outline package, ceramic flat pack, ceramic quad flat-pack, ceramic column grid array, or ceramic pin grid array. The outer package may be a lead-less frame package. Each of the bond wires may form a spring. Each of the springs may be planar springs. The elastic filler material may surround the silicon die on at least four sides. The elastic filler material may expand and contract with temperature change. The elastic filler and gas ball filler material may be used to control shrinkage or expansion coefficients and enhance thermal conductivity within the integrated circuit package. The elastic filler material may provide shock absorption between the silicon die and the additive material. Planar springs may allow the silicon die to stay electrically connected to the additive material during thermal expansion, thermal contraction, or a shock event. Planar springs may allow the silicon die to stay electrically connected to the outer package during thermal expansion, thermal contraction, or a shock event.

Micro filler balls, micro spheres, or micro balloons, are lightweight and when added to a mixture, will reduce the weight, increases the strength to weight ratio, and also reduce the coefficient of linear expansion making the composite more dimensionally stable. Radar transparency can be increased with the use of microspheres. Adding micro balloons also modifies the electrical conductivity and dielectric characteristics of a material. The addition of microsphere helps control shrinkage of molded products. It also adds insulating qualities. Plastic or polymeric microspheres are elastic and will bounce back from stress.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings.

Figure 1:
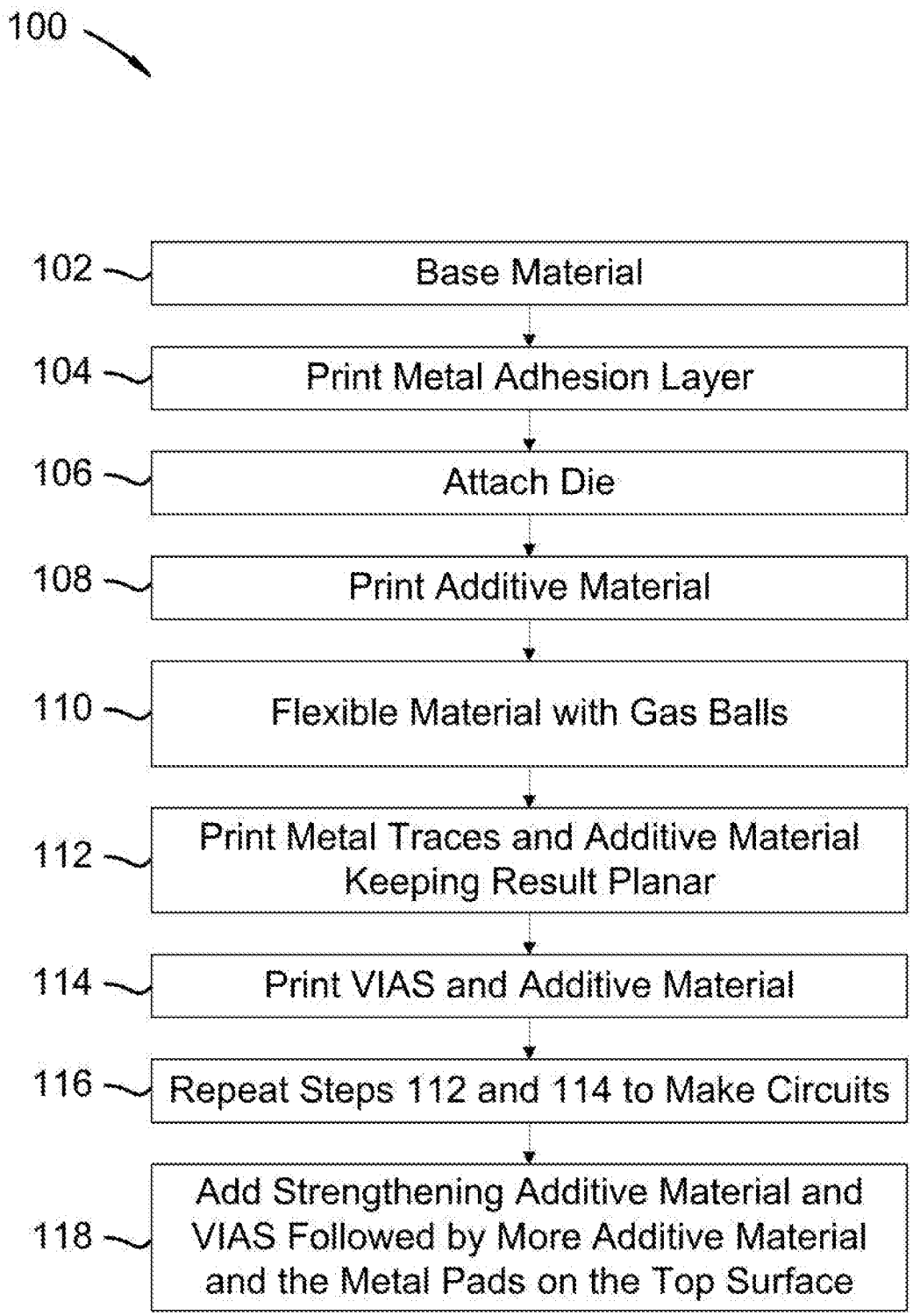
FIG. 1 shows a flow diagram in accordance with an embodiment of the invention.
Figure 2:
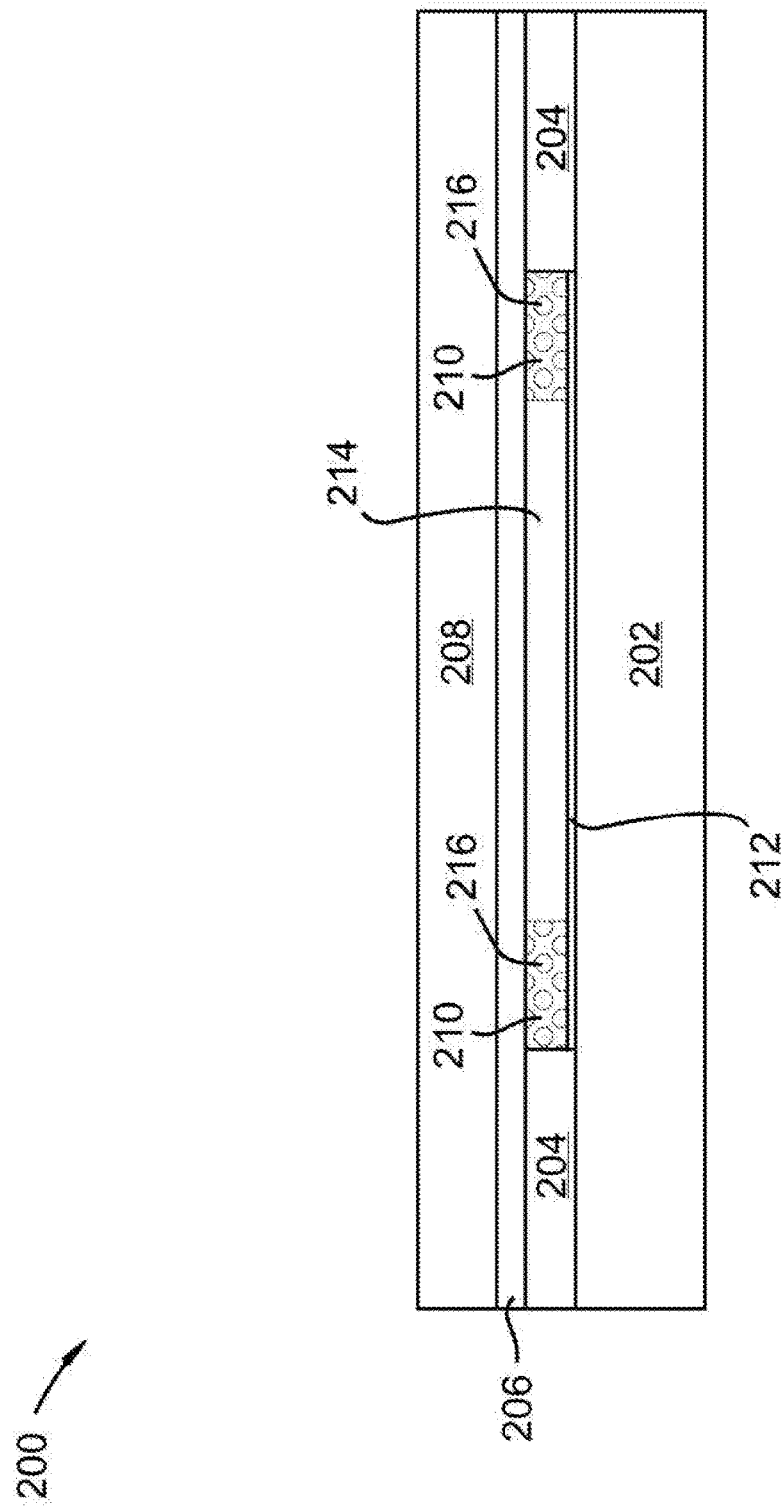
FIG. 2 shows a cross-sectional side view of an IC package in accordance with an embodiment of the invention.
Figure 3:
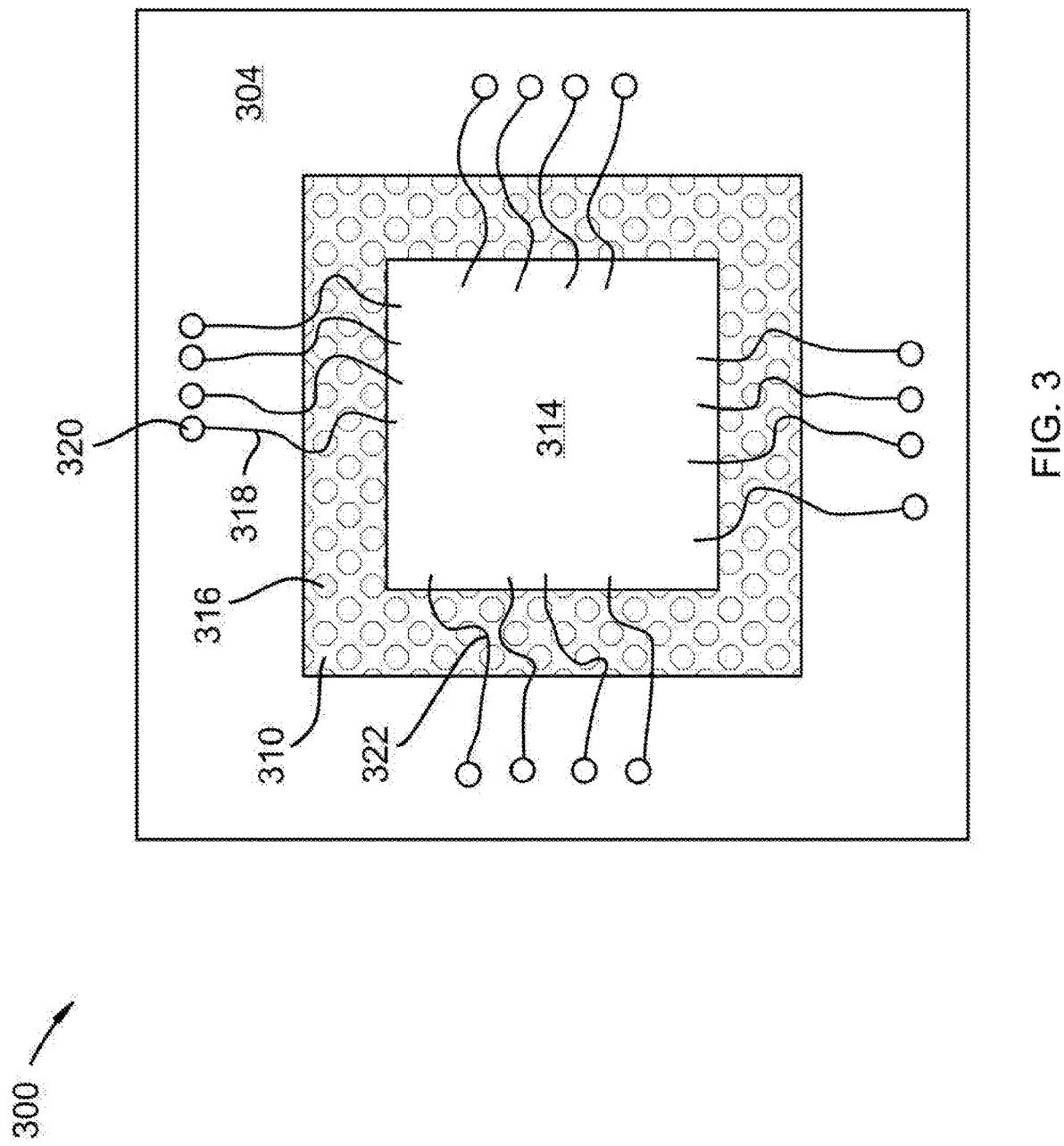
FIG. 3 shows a top-view of an internal layer of an IC package in accordance with an embodiment of the invention.
Figure 5:
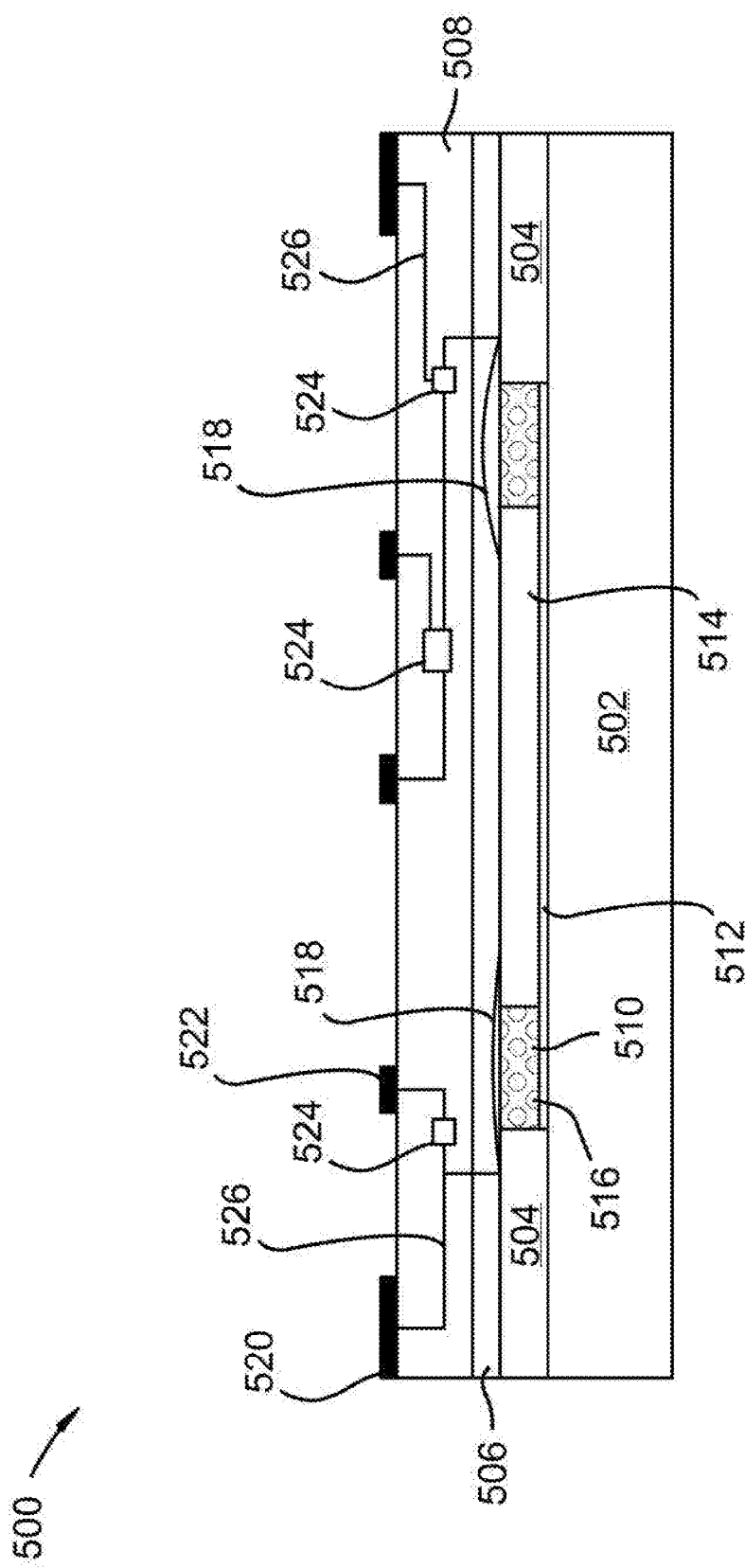
FIG. 5 shows a cross-sectional side view of an IC package in accordance with an embodiment of the invention.

FIG. 1 shows a flow diagram 100 in accordance with an embodiment of the invention. At step 102, a base material, such as ceramic or metallized ceramic, is used to create a foundation for building an Integrated Circuit (IC). The ceramic/metallized ceramic may provide heat shielding, electromagnetic shielding, and bonding surfaces for construction of the IC. A metal adhesion layer 104 may be formed by printing metal directly on the ceramic base material. A silicon die 106 may be attached to the base material by way of the metal adhesion layer 104. At step 108, additive material such as epoxies, thermoplastics, thermosetting resins, metals, alloys, aluminum oxide, silicon oxide, silicon dioxide, silicon nitride, titanium oxide, aluminum nitride, diamond, calcium carbonate, oxides, polymers, polyanilines, polythiophenes, poly-p-phenylene sulfides, polyacetylenes, mixtures thereof and copolymers made from the monomers to form the above polymers, may be printed and/or poured substantially surrounding a silicon die leaving a finable area between the additive material and the silicon die. At step 110, flexible filler material including gas filled spheres, gas filled micro balloons, gas filled micro balls, or gas filled micro geometric shapes are disposed between the additive material and the silicon die. The gas filled material may be made from vinyl, silicon, acrylic, synthetic resins, or phenols. Gas within the gas filled material may include inert gases, nitrogen, and other mixtures known gases and mixtures of gases which create a thermal expansion coefficient, which is desirable at a specific target temperature or temperature range. The gas filled fillet material may comprises one or more of gas filled spheres, gas filled micro balloons, gas filled micro balls, or gas filled micro geometric shapes. Such gas filled materials may be produced by chemical bubbling or gas bubbling through a glass, polymer, or other curable resin to form gas filled particles or shapes. Additional filler material surrounding and binding the gas filled filler material may include: epoxies, thermoplastics, thermosetting resins, metals, alloys, oxides, polymers, polyanilines, polythiophenes, poly-p-phenylene sulfides, polyacetylenes and mixtures thereof and copolymers made from monomers to form the above polymers. The flexible material, the additive material, and the silicon die are all kept substantially planar with a top surface of the silicon die. At step 112, metal bond traces may be printed to connect the silicon die to the additive material. The metal bond wires may form planar springs and be printed substantially planar to the top of the silicon die or imbedded within the filler material and/or the additive materials as shown in FIGS. 2, 3, and 5. At step 114, additional additive material is applied forming vias, circuitry, and/or packaging material of the IC. At steps 116 and 118, additional layers may be printed adding vias, circuitry, and/or packaging material to complete electrical connection between the silicon die and the outer package of the IC.

FIG. 2 shows a cross-sectional side view 200 of an IC package in accordance with an embodiment of the invention. Metal layer 212 is disposed on a portion of base material 202. Additive material 204 substantially surrounds silicon die 214 with filler material 210 and 216 disposed between the additive material 204 and the silicon die 214. Flexible filler material 210 including gas filled balls 216, micro balloons 216, and/or micro spheres 216 are disposed between the additive material 204 and the silicon die 214. The gas filled balls 216 may be made from vinyl, silicon, acrylic, synthetic resins, or phenols. The gas filled filler material may comprises one or more of gas filled spheres, gas filled micro balloons, gas filled micro balls, or gas filled micro geometric shapes. Such materials may be produced by chemical bubbling or gas bubbling through a glass, polymer, or other curable resin to form gas filled particles or shapes. Gas within the balls 216 may include inert gases, nitrogen, and other mixtures of known gases and mixtures of gases which create a thermal expansion coefficient which is desirable at a specific target temperature or temperature ranges within IC 200. Additive materials 204, 206, and 208 may comprise epoxies, thermoplastics, thermosetting resins, metals, alloys, aluminum oxide, silicon oxide, silicon dioxide, silicon nitride, titanium oxide, aluminum nitride, diamond, calcium carbonate, oxides, polymers, polyanilines, polythiophenes, poly-p-phenylene sulfides, polyacetylenes, mixtures thereof and copolymers made from the monomers to form the above polymers, may be printed and for poured substantially surrounding a silicon die leaving a tillable area between the additive material and the silicon die. Additional additive material 206 and 208 may form electrical connections, including circuitry, between silicon die 214 and an outer surface of IC package 200. The outer package 208 may be constructed as a pin grid array, ball grid array, fine pitch ball grid array, or low profile ball grid array, ceramic package, ceramic dual inline package, ceramic leadless carrier, ceramic ball grid array, ceramic small outline package, ceramic flat pack, ceramic quad flat-pack, ceramic column grid array, or ceramic pin grid array. The outer package may be one of ceramic package, ceramic dual inline package, ceramic leadless carrier, ceramic ball grid array, ceramic small outline package, ceramic flat pack, ceramic quad flat-pack, ceramic column grid array, or ceramic pin grid array. The outer package may be a lead-less frame package. Bond wire (not visible) provide electrical connections between the die 214 and the outer package 208. The bond wires may form planar springs or form arching wires which are able to move with thermal expansion, contraction, and shock absorption.

FIG. 3 shows a top-view of an internal layer of an IC package in accordance with an embodiment of the invention. Additive material 304 substantially surrounds silicon die 314 with elastic filler material 310 and 316 disposed between the additive material 204 and the silicon die 214. Flexible filler material 310 including gas filled balls 316, micro balloons 316, or micro spheres 116 are disposed between the additive material 304 and the silicon die 314. The gas filled filler material may comprises one or more of gas filled spheres, gas filled micro balloons, gas filled micro balls, or gas filled micro geometric shapes. Such materials may be produced by chemical bubbling or gas bubbling through a glass, polymer, or other curable resin to form gas filled particles or shapes. The gas filled balls 316 may be made from vinyl, silicon, acrylic, synthetic resins, or phenols. Gas within the balls 316 may include inert gases, nitrogen, and other mixtures of known gases and mixtures of gases which create a thermal expansion coefficient which is desirable at a specific target temperature or temperature ranges within IC 300. Additional filler material 310 surrounding and binding the gas filled balls may include: epoxies, thermoplastics, thermosetting resins, metals, alloys, oxides, polymers, polyanilines, polythiophenes, poly-p-phenylene sulfides, polyacetylenes and mixtures thereof and copolymers made from monomers to form the above polymers. The flexible material 310, 316, the additive material 304, and the silicon die 314 may be all kept substantially planar with a top surface of the silicon die. Additive material 304 may comprise epoxies, thermoplastics, thermosetting resins, metals, alloys, aluminum oxide, silicon oxide, silicon dioxide, silicon nitride, titanium oxide, aluminum nitride, diamond, calcium carbonate, oxides, polymers, polyanilines, polythiophenes, poly-p-phenylene sulfides, polyacetylenes, mixtures thereof and copolymers made from the monomers to form the above polymers, may be printed and/or poured substantially surrounding a silicon die leaving a fillable area between the additive material and the silicon die. Additional additive material may form electrical connections, including circuitry and embedded components, between silicon die 314 and an outer surface of IC package 300. Bond wires 322, 318 may form planar springs or form arching wires which are able to move with thermal expansion, contraction, and shock absorption provided by flexible filler materials 310 and 316.

Figure 4:
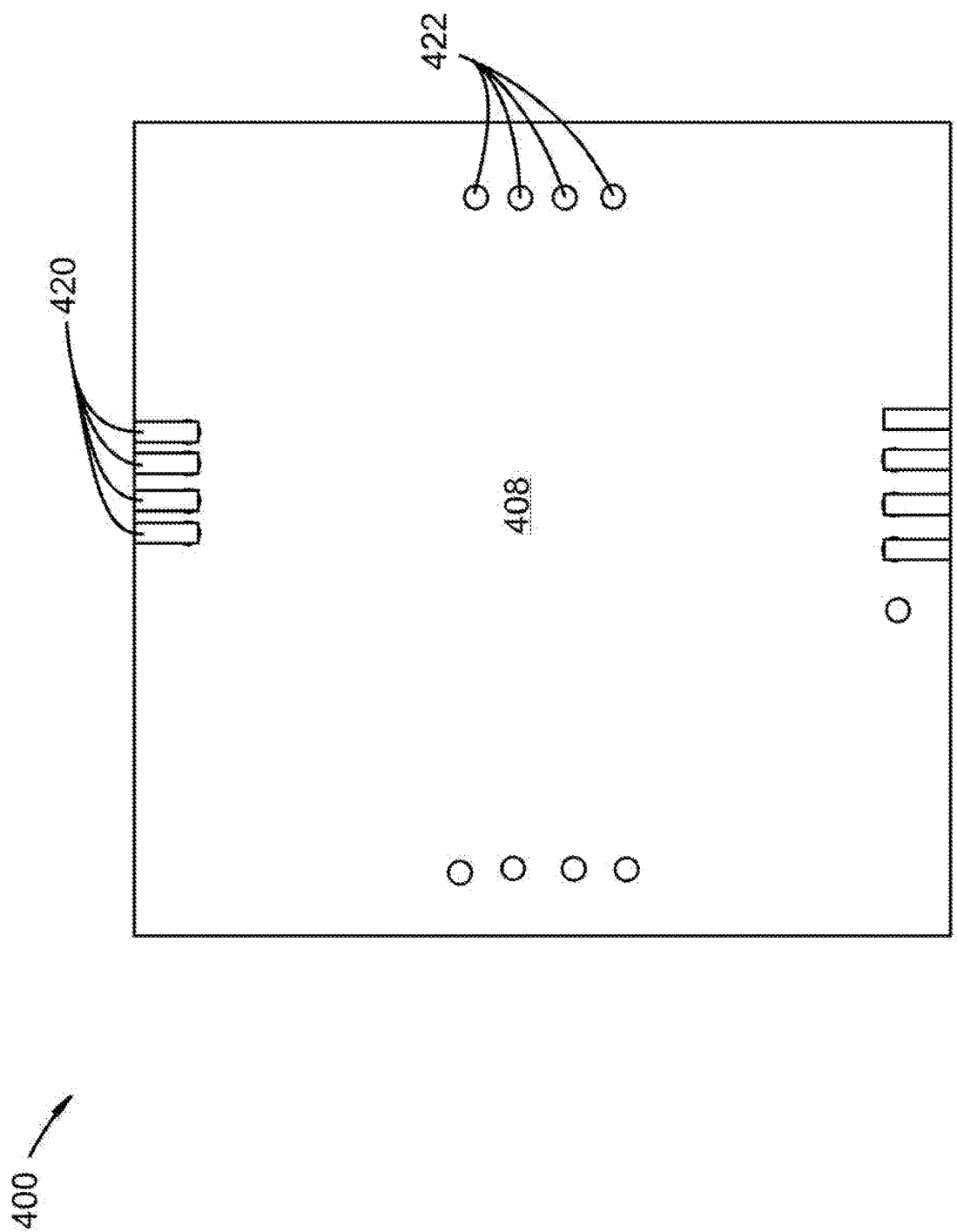
FIG. 4 shows an external view of an IC package in accordance with an embodiment of the invention.

FIG. 4 shows an external view of an IC package 408 in accordance with an embodiment of the invention. IC 400 is shown with a leadless frame package 408 including electrical connections 422 and 420 which connect to an inner silicon die. The outer package 408 may alternately be one of a pin grid array, ball grid array, fine pitch ball grid array, low profile ball grid array, ceramic package, ceramic dual inline package, ceramic leadless carrier, ceramic ball grid array, ceramic small outline package, ceramic flat pack, ceramic quad flat-pack, ceramic column grid array, or ceramic pin grid array.

FIG. 5 shows a cross-sectional side view of an IC package 500 in accordance with an embodiment of the invention. Metal layer 512 is disposed on a portion of base material 502. Additive material 504 substantially surrounds silicon die 514 with filler material 510 and 216 disposed between the additive material 504 and the silicon die 514. Flexible filler material 510 including gas filled balls 516, micro balloons 516, and/or micro spheres 516 are disposed between the additive material 504 and the silicon die 514. The gas filled filler material may comprises one or more of gas filled spheres, gas filled micro balloons, gas filled micro halls, or gas filled micro geometric shapes. Such materials may be produced by chemical bubbling or gas bubbling through a glass, polymer, or other curable resin to form gas filled particles or shapes. The gas filled balls 516 may be made from vinyl, silicon, acrylic, synthetic, resins, or phenols. Gas within the balls 516 may include inert gases, nitrogen, and other mixtures of known gases and mixtures of gases which create a thermal expansion coefficient which is desirable at a specific target temperature or temperature ranges within IC 500. Additive materials 504, 506, and 508 may comprise epoxies, thermoplastics, thermosetting resins, metals, alloys, aluminum oxide, silicon oxide, silicon dioxide, silicon nitride, titanium oxide, aluminum nitride, diamond, calcium carbonate, oxides, polymers, polyanilines, polythiophenes, poly-p-phenylene sulfides, polyacetylenes, mixtures thereof and copolymers made from the monomers to form the above polymers, may be printed and/or poured substantially surrounding a silicon die leaving a fillable area between the additive material and the silicon die. Additional additive material 506 and 508 may form electrical connections 526, including circuitry 526, 524, between silicon die 514 and an outer surface of IC package 500. Circuitry 526 and 524 may include active and passive components as well as vias and wires. IC 500 is shown with a leadless frame package 508 including electrical connections 522 and 520 which connect to an inner silicon die 512. Outer IC package 508 may be constructed as a pin grid array, ball grid array, fine pitch ball grid array, or low profile ball grid array, ceramic package, ceramic dual, inline, package, ceramic leadless carrier, ceramic ball grid array, ceramic small outline package, ceramic flat pack, ceramic quad flat-pack, ceramic column grid array, or ceramic pin grid array. The outer package may be one of ceramic package, ceramic dual inline package, ceramic leadless carrier, ceramic ball grid array, ceramic small outline package, ceramic flat pack, ceramic quad flat-pack, ceramic column grid array, or ceramic pin grid array. The outer package may be a lead-less frame package. Bond wires 518 provide electrical connections between the die 514 and the outer package connectors 520, 522. The bond wires 548 may form planar springs or form arching wires which are able to move with thermal expansion, contraction, and shock absorption.

Figure 6:
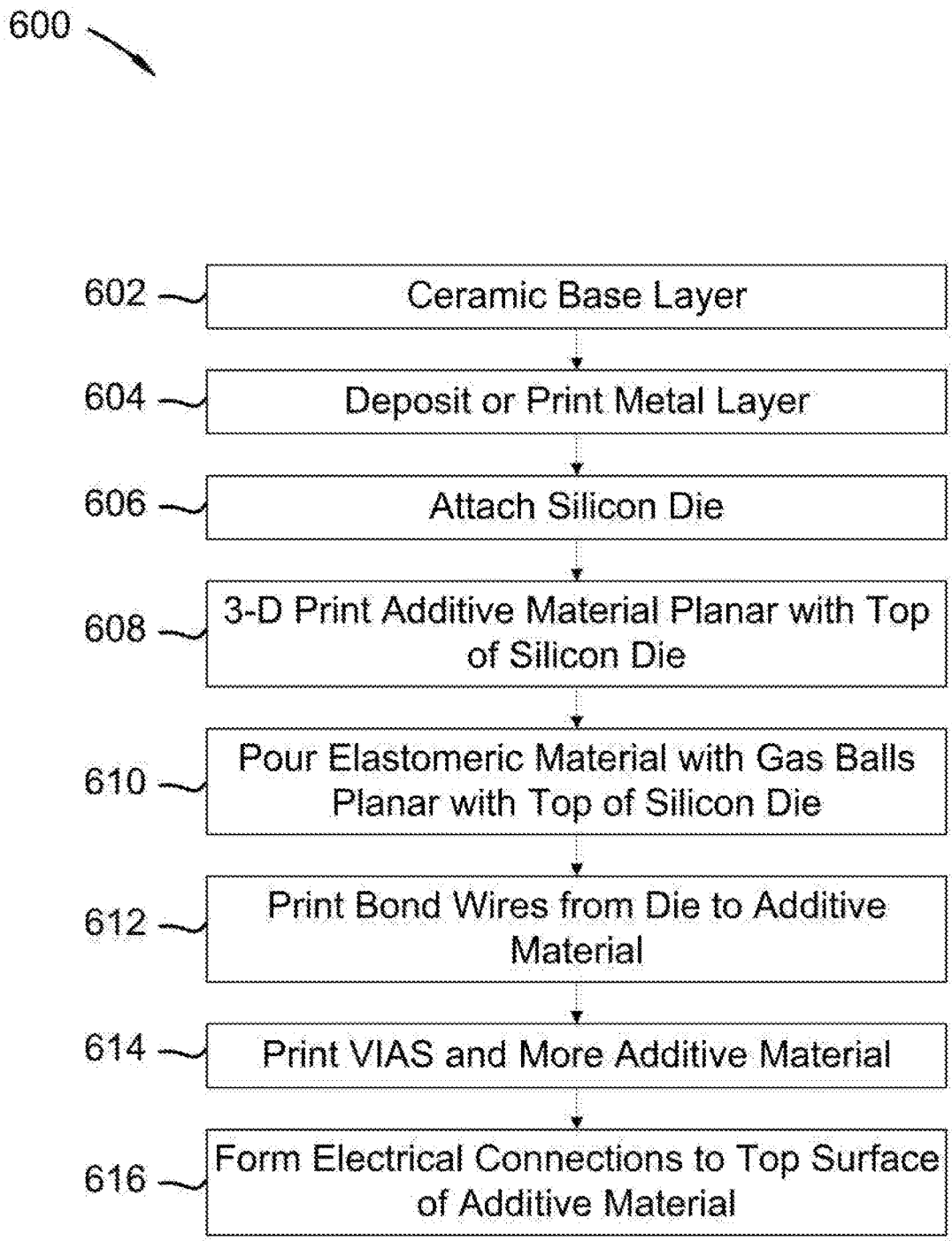
FIG. 6 shows a flow diagram in accordance with an embodiment of the invention.

FIG. 6 shows a flow diagram in accordance with an embodiment of the invention. At step 602, a base material, such as ceramic or metallized ceramic, is used to create a foundation for building an Integrated Circuit (IC). The ceramic/metallized ceramic may provide heat shielding, electromagnetic shielding, and bonding surfaces for construction of the IC. A metal adhesion layer 604 may be formed by printing metal directly on the ceramic base material or through metal deposition. A silicon die 606 may be attached to the base material by way of the metal adhesion layer 604. At step 608, additive material such as epoxies, thermoplastics, thermosetting resins, metals, alloys, aluminum oxide, silicon oxide, silicon dioxide, silicon nitride, titanium oxide, aluminum nitride, diamond, calcium carbonate, oxides, polymers, polyanilines, polythiophenes, poly-p-phenylene sulfides, polyacetylenes, mixtures thereof and copolymers made from the monomers to form the above polymers, may be 3-D printed and/or poured substantially surrounding a silicon die leaving a finable area between the additive material and the silicon die. At step 610, flexible filler material including gas filled balls, micro balloons, or micro spheres are disposed between the additive material and the silicon die. The gas filled balls may be made from vinyl, silicon, acrylic, synthetic resins, or phenols. Gas within the balls may include inert gases, nitrogen, and other mixtures known gases and mixtures of gases which create a thermal expansion coefficient which is desirable at a specific target temperature or temperature range. Additional filler material surrounding and binding the gas filled balls may include, epoxies, thermoplastics, thermosetting resins, metals, alloys, oxides, polymers, polyanilines, polythiophenes, poly-p-phenylene sulfides, polyacetylenes and mixtures thereof and copolymers made from monomers to form the above polymers. The flexible material, the additive material, and the silicon die are all kept substantially planar with a top surface of the silicon die. At step 612, metal bond traces may be printed to connect the silicon die to the additive material. The metal bond wires may form planar springs and be printed substantially planar to the top of the silicon die or imbedded within the filler material and/or the additive materials as shown in FIGS. 2, 3, and 5. At step 614, additional additive material is applied forming vias, circuitry, and/or packaging material of the IC. At step 616, additional layers may be printed adding vias, circuitry, and/or packaging material to complete electrical connection between the silicon die and the outer package of the IC.

Figure 7:
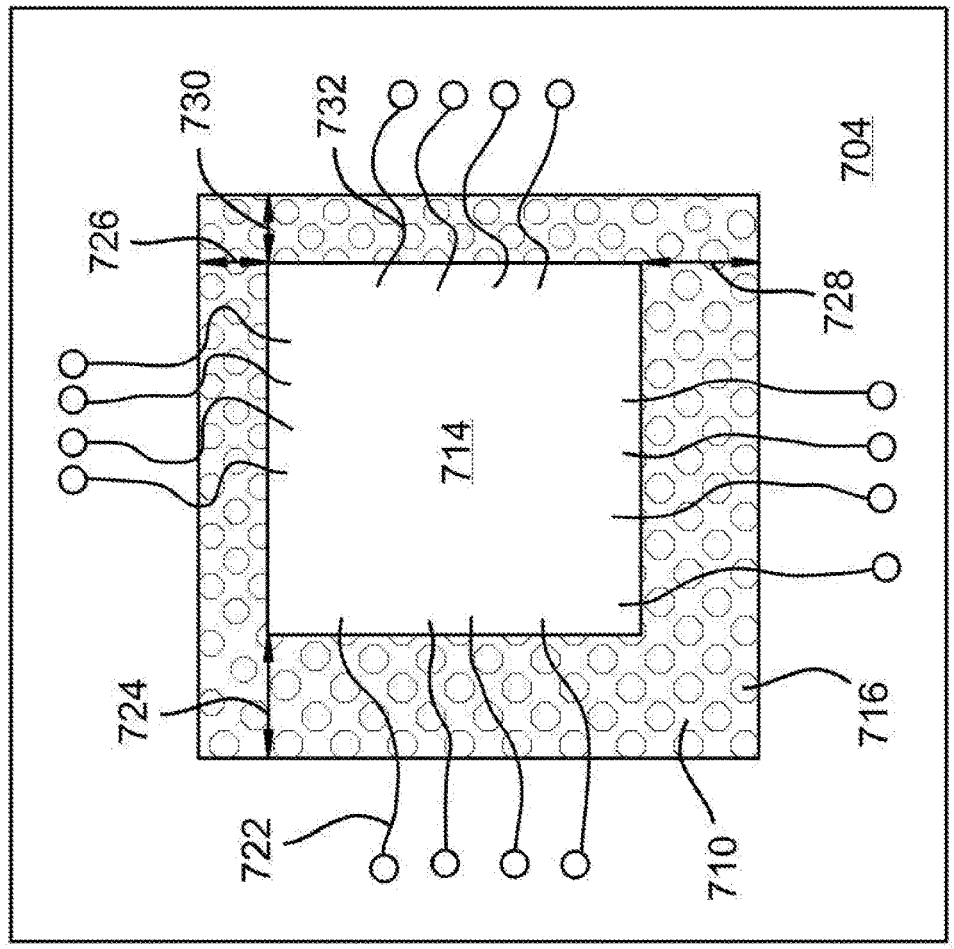
FIG. 7 shows a top-view of an internal layer of an IC package in accordance with an embodiment of the invention.

FIG. 7 shows a top-view of an internal layer of an IC package 700 in accordance with an embodiment of the invention. Additive material 704 substantially surrounds silicon die 714 with elastic filler material 710 and 716 disposed between the additive material 704 and the silicon die 714. Flexible filler material 710 may include gas filled balls 316, micro balloons 716, and/or micro spheres 716 are disposed between the additive material 704 and the silicon die 714. The gas filled balls 716 may be made from vinyl, silicon, acrylic, synthetic resins, or phenols. Gas within the balls 716 may include inert gases, nitrogen, and other mixtures of known gases and mixtures of gases which create a thermal expansion coefficient which is desirable at a specific target temperature or temperature ranges within IC 700. Additional filler material 710 surrounding and binding the gas filled balls may include: epoxies, thermoplastics, thermosetting resins, metals, alloys, oxides, polymers, polyanilines, polythiophenes, poly-p-phenylene sulfides, polyacetylenes and mixtures thereof and copolymers made from monomers to form the above polymers. The flexible material 710, 716, the additive material 704, and the silicon die 714 may be all kept substantially planar with a top surface of the silicon die. Additive material 704 may comprise epoxies, thermoplastics, thermosetting resins, metals, alloys, aluminum oxide, silicon oxide, silicon dioxide, silicon nitride, titanium oxide, aluminium nitride, diamond, calcium carbonate, oxides, polymers, polyanilines, polythiophenes, poly-p-phenylene sulfides, polyacetylenes, mixtures thereof and copolymer made from the monomers to form the above polymers, may be printed and/or poured substantially surrounding silicon die leaving a fillable area between the additive material and the silicon die. Additional additive material may form electrical connections, including circuitry and embedded components, between silicon die 714 and an outer surface of IC package 700. Bond wires 722, 732 may form planar springs or form arching which are able to move with thermal expansion, contraction, and shock absorption provided by flexible filler materials 710 and 716. Silicon die 714 is shown shifted up and to the right as evidenced by distance 724 and distance 728 being larger than distances 726 and 730. This shift may be due to thermal expansion, contraction or mechanical shock. Bond wires 722 and 732 have worked as a spring and flexible filler materials 710, 716 have moved to compensated for mechanical and/or heat stress. The gas filled balls 716 on the left side have expanded while the gas balls on the right side have compressed allowing the silicon die to remain electrically connected and functional under temperature and stress conditions.

The systems and methods disclosed herein may be embodied in other specific forms without departing from their spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. An integrated circuit package comprising:
a ceramic base material;
a metal adhesion layer disposed on the ceramic base material;
a silicon die having a top surface and a bottom surface, wherein the bottom surface of the silicon die is attached to the ceramic base material by way of the metal adhesion layer, the silicon die comprising an integrated circuit;
an additive material disposed on the ceramic base material, wherein the additive material provides a continuous boundary that surrounds each side of the silicon die to form a fillable area between the additive material and the silicon die, and wherein a top surface of the additive material is substantially planar with the top surface of the silicon die;
a flexible filler material disposed in the fillable area, the flexible filler material comprising a gas filled material, wherein a top surface of the flexible filler material is substantially planar with the top surface of the silicon die;
bond wires electrically connecting the silicon die to the additive material;
an outer surface opposite the ceramic base material, the outer surface comprising one or more electrical connectors; and
an additional additive material disposed on each of the top surface of the silicon die, the top surface of the flexible filler material, and the top surface of the additive material, wherein the additional additive material is between the outer surface and each of the top surface of the silicone die, the top surface of the flexible filler material, and the top surface of the additive material.

2. The integrated circuit package of claim 1, wherein the gas filled material comprises one or more of gas filled spheres, gas filled micro balloons, gas filled micro balls, or gas filled micro geometric shapes.

3. The integrated circuit package of claim 1, wherein the additive material is printed from the ceramic base material to a height which is substantially planar to the top surface of the silicon die.

4. The integrated circuit package of claim 1, further comprising traces electrically connecting the bond wires to the one or more electrical connectors.

5. The integrated circuit package of claim 1, wherein the flexible filler material comprises a filler material that surrounds the gas filled material.

6. The integrated circuit package of claim 1, wherein the top surface of the flexible filler material forms a generally planar surface.

7. The integrated circuit package of claim 4, wherein the bond wires are connected to the traces in the additive material.

8. The integrated circuit package of claim 1, wherein the additive material forms at least a portion of an outer portion of the integrated circuit package.

9. The integrated circuit package of claim 1, wherein the one or more electrical connectors comprise one or more electrically conductive pins, balls, or traces.

10. The integrated circuit package of claim 1, wherein the one or more electrical connectors form one of a pin grid array, ball grid array, fine pitch ball grid array, or low profile ball grid array.

11. The integrated circuit package of claim 1, wherein the outer surface forms at least a portion of one of ceramic package, ceramic dual inline package, ceramic leadless carrier, ceramic ball grid array, ceramic small outline package, ceramic flat pack, ceramic quad flat-pack, ceramic column grid array, or ceramic pin grid array.

12. The integrated circuit package of claim 1, wherein the outer surface forms at least a portion of a lead-less frame package.

13. The integrated circuit package of claim 4, wherein each of the bond wires form a spring.

14. The integrated circuit package of claim 13, wherein each of the springs are planar springs.

15. The integrated circuit package of claim 1, wherein the flexible filler material surrounds the silicon die on at least four sides.

16. The integrated circuit package of claim 1, wherein the flexible filler material expands and contracts with temperature change.

17. The integrated circuit package of claim 1, wherein the flexible filler material functions as a shock absorber between the silicon die and the additive material.

18. The integrated circuit package of claim 14, wherein the planar springs allow the silicon die to stay electrically connected to the traces in the additive material during thermal expansion, thermal contraction, or a shock event.

19. The integrated circuit package of claim 14, wherein the planar springs allow the silicon die to stay electrically connected to the one or more electrical connectors during thermal expansion, thermal contraction, or a shock event.

* * * * *